United States Patent [19]

Hill et al.

[11] 4,048,462

[45] Sept. 13, 1977

[54] COMPACT ROTARY EVAPORATION SOURCE

[75] Inventors: Russell J. Hill; Kazumi N. Tsujimoto, both of El Cerrito, Calif.

[73] Assignee: Airco, Inc., Montvale, N.J.

[21] Appl. No.: 541,743

[22] Filed: Jan. 17, 1975

[51] Int. Cl.² .......................................... C23C 13/12
[52] U.S. Cl. ............................. 219/121 EB; 118/49.1
[58] Field of Search ................ 219/121 EB, 121 EM; 427/42; 118/49.1, 49.5; 13/31

[56] References Cited

U.S. PATENT DOCUMENTS

| | | | |
|---|---|---|---|
| 3,360,600 | 12/1967 | DuBois | 219/121 EB X |
| 3,382,843 | 5/1968 | Thelen et al. | 118/49.1 |
| 3,420,977 | 1/1969 | Hanks et al. | 219/121 EB |
| 3,454,814 | 7/1969 | Mancebo | 219/121 EB X |
| 3,472,999 | 10/1969 | Yamamoto et al. | 219/121 EB |
| 3,526,206 | 9/1970 | Jones | 118/49.1 |
| 3,544,763 | 12/1970 | Geir | 219/121 EB X |
| 3,655,902 | 4/1972 | Firestone et al. | 13/31 |
| 3,655,903 | 4/1972 | Roman et al. | 13/31 |
| 3,684,557 | 8/1972 | Kienel | 427/42 |
| 3,695,217 | 10/1972 | Jacobsson | 219/121 EB |
| 3,913,520 | 10/1975 | Berg et al. | 118/49.1 X |

*Primary Examiner*—J. V. Truhe
*Assistant Examiner*—Clifford C. Shaw
*Attorney, Agent, or Firm*—David A. Draegert; Edmund W. Bopp

[57] ABSTRACT

An electron-beam apparatus for evaporating material is disclosed. The apparatus comprises a rotatable hearth on which the evaporant material can be placed and an electron-beam source which can be energized to evaporate the material. The apparatus is compact and durable because the electron beam source occupies a protected location which is closer to the rotational axis than is the hearth.

11 Claims, 4 Drawing Figures

COMPACT ROTARY EVAPORATION SOURCE

BACKGROUND OF INVENTION

1. Field of the Invention

This invention relates to vacuum vapor deposition of coatings onto substrates. More particularly the invention relates to a vapor source in which material for the coating is placed on a rotating hearth and evaporated by an electron beam.

2. Description of the Prior Art

There are many well-known techniques for coating a substrate by vacuum vapor deposition. Vapor sources allowing evaporation of a variety of materials have been developed. Particularly difficult problems are encountered when it is sought to vaporize a material, either a metal or a non-metal, which has a melting point of several hundred degrees. The principal problem is finding a suitable container which will not disintegrate and will not interact with the evaporant material and thereby contaminate the coating deposited on the substrate.

Electron beams are often employed in evaporation apparatus because they can be directed to a confined impact area on the surface of the target material to be evaporated. The maximum heating and the desired evaporation occur on the exposed surface of the evaporant material and not any part of the crucible or the surface of the material which is in contact with the crucible. Thus, the crucible can be cooled to minimize any reaction involving it. Greatly increased crucible life and greatly reduced contamination of the deposited coating are thus possible. A further advantage of the use of electron beams is close control of the evaporation process. Because the electron-beam power and impact area can be rapidly varied and closely regulated, the evaporant material temperature and the evaporation rate can be maintained at any desired level.

An electron beam is usually obtained by use of an electron gun comprising a heated filament and an anode. The thermally emitted electrons are accelerated to high velocities by applying a large potential difference between the filament and the anode. In order to reduce arcing between the closely spaced gun components, it is desirable to separate and isolate the electron gun from the streaming vapor generated by the evaporation of the target material. Effective separation can be obtained by placing the electron gun off to one side and preferably below the material to be evaporated. Some means, such as a permanent magnet and two planar pole pieces, are used to deflect the beam through a large angle, such as 180° or 270°, before the beam is incident on the impact area. When 270° deflection is used, a cover can be placed directly over the electron gun source to prevent debris from falling into the vicinity of the gun.

In addition to the beam deflection means, a second magnetic means, such as one or more electro magnets can be used to sweep the beam and thus to vary the location of the impact area of the beam. Heating irregularities caused by non-uniform electron density can be minimized by repetitive sweeping of the beam over the evaporant material.

Vapor sources which use a rotating crucible or a series of crucibles are also known. Use of a series of crucibles on a rotatable turret allows the evaporation of a series of different materials in one coating cycle. Use of one large rotatable crucible allows continuous evaporation of a large amount of material. If even longer evaporation cycles are desired, automatic loading devices can be used to replenish the material in the rotating crucible.

One important use of a cooled rotating hearth, such as will be described below, is in coating a heat sensitive substrate, such as a plastic part. In order to avoid softening of the plastic it is necessary to minimize the heat transferred to the substrate by radiation. This can be accomplished by loading the evaporant material in an annular pattern onto the rotating crucible at a controlled rate, and then completely evaporating the mixture as it passes through the electron beam impact area. Radiant heating of the substrate is minimized because the entire surface of the hearth is at a low temperature except for the small portion of the evaporant material in the impact area, and this portion is vaporized completely. Deposition of coatings by such a method of evaporation to dryness is disclosed in U.S. application Ser. No. 480,909 filed June 19, 1974, now abandoned. When a coating is deposited by this method, the composition of the evaporant material is duplicated in the coating, even if the composition is a mixture of components which have widely different vapor pressures and melting points. Thus, it is relatively easy to deposit a coating of an alloy of tungsten and aluminum, for example, which is very difficult to form by other methods.

Vapor sources have been developed which utilize a rotating crucible and a fixed electron-beam source with magnetic deflection and sweeping means. In previous apparatus of this type, the electron beam source and the deflection magnets were located outside the perimeter of the rotating crucible. This is a disadvantage because large pole pieces are then required even for a relatively small diameter rotating crucible.

SUMMARY OF INVENTION

The present invention relates to a vapor source utilizing a rotatable annular hearth or crucible in which the electron beam source, including the beam deflection means, is located closer to the axis of rotation than is the outer perimeter of the hearth, i.e., within the perimeter of the hearth.

Compactness is an important object of the present vapor source. Because of the location of the electron beam source and deflection means, a much larger hearth can be located in a given amount of space. This is important because interior space, particularly horizontal space, is usually quite limited in a vacuum chamber.

Because many vacuum chambers are circular cylinders, a further object of the present vapor source is that the outer perimeter of the vapor source can be a circle. Thus the present invention allows the use of a hearth which is only slightly smaller than the vacuum chamber. Thus a much larger amount of material can be conveniently evaporated before it is necessary to reload the crucible.

Another object of the present invention is that the electron beam source and deflection means are so compact and so located that three or four electron beam sources could be located inside an annular hearth which could still fit inside a standard 18 in. (46 cm) or 24 in. (61 cm) diameter vacuum chamber. In some applications, use of a plurality of electron beans would greatly increase the obtainable evaporation rate and coating output.

Still another object of the present vapor source is that the electron-beam source is enclosed. The electron gun is protected from streaming vapor and falling debris by a cover plate. Further, the enclosed space may easily be provided with a separate vacuum port so that a high vacuum can be maintained in the vicinity of the electron gun even at very high evaporation rates.

The hearth and the cover plate over the electron beam source are both provided with fluid conduits so that the temperature of the hearth and cover plate can be controlled. This is an advantage when it is desired to coat a substrate which decomposes or softens at low temperature. By cooling the hearth and the cover plate, radiant heating of the substrate can be minimized.

Despite its compactness, the present invention allows the electron beam source to be easily and quickly removed for periodic servicing and replacement of the filament.

BRIEF DESCRIPTION OF DRAWINGS

FIG. 4 is a partial cross-sectional view of the vapor source as it appears when cut along line 4—4 in FIG. 1.

DESCRIPTION OF PREFERRED EMBODIMENTS

Figure 1:
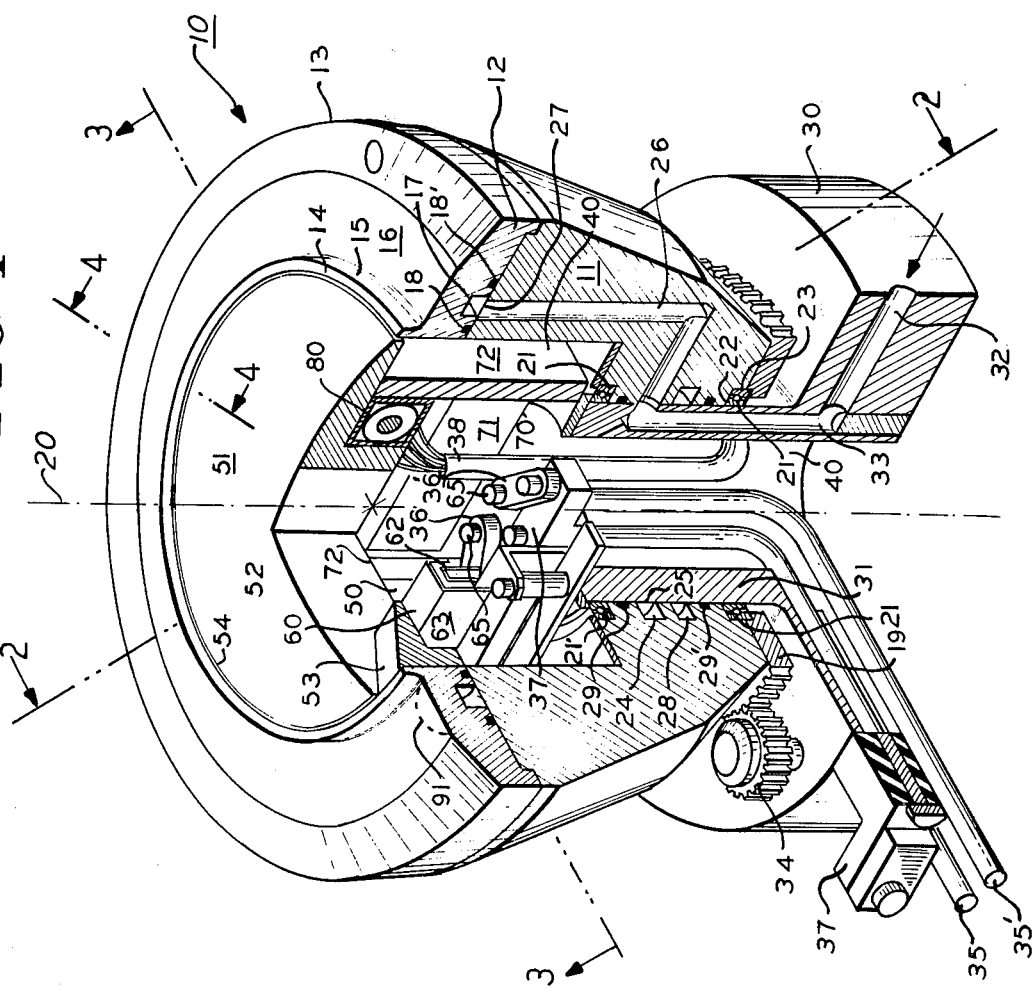
FIG. 1 is a perspective view of the vapor source in which a portion has been cut away to illustrate some of the features of the construction of the source.

Referring to FIG. 1, very generally the vapor source includes a hearth assembly 10, a base 30, and an electron-beam source 50.

The hearth assembly 10 has a lower portion 11 which supports an annular hearth 12 which has an outer perimeter 13 and an inner perimeter 14. The hearth has a rim 15 along its inner perimeter and an annular area 16 for receiving material to be evaporated. The hearth could, of course, have a second rim along the outer perimeter 13 so as to form an annular crucible. The hearth is preferably made from a material that has a high thermal conductivity, such as copper.

The hearth assembly is rotatably mounted on the base 30. The base has an upward extension 31 which forms axle around which the rotatable hearth assembly can revolve. In this embodiment, the rotational axis 20 is at the center of the circular perimeters 13 and 14 and perpendicular to the annular area 16. It will be realized that the outer perimeter could be some other shape such as a polygon. In any event there will be a point of the hearth which is furthest from the axis of rotation.

The hearth assembly is able to revolve easily and smoothly because of two sets of ball bearings, a lower set including ball 21 and an upper set including ball 21'. The lower set of bearings runs in a race of which one side 22 is attached to the base and the other side 23 is attached to the rotatable assembly. The upper set of bearings is similarly arranged. A large annular gear 19 is fixed to the bottom edge of the lower portion 11 of the rotatable hearth assembly. The large annular gear meshes with a small gear 34 rotatably mounted on the base. Rotational drive means (not shown) is used to rotate the small gear 34 which can then rotate the hearth assembly intermittently or continuously at any desired rate such as one revolution per minute.

The apparatus is provided with a means for controlling the temperature of the hearth. One such means is a first fluid conduit through which a fluid, such as water, can be circulated through the hearth. The base 30 has a fluid inlet 32 which leads to a vertical passageway 33 which is interior to the upward extension 31 of the base. From the top of the vertical passageway the fluid can flow from the base into a circumferential entrance channel 24 which is cut into the lower portion of the rotatable assembly. The inner wall 25 of the entrance channel is provided by the upward extension 31 of the base. From the channel 24 the fluid can flow into an internal passageway 26 in the lower portion 11 of the rotatable hearth assembly. The passageway 26 leads upward to an entrance opening 27 into a channel 17. The channel 17 is cut into the underside of the hearth and underlies the annular area 16 on which the evaporant material is placed. Two O-rings, an inner one 18 and an outer one 18', provide a fluid seal between the underside of the hearth 12 and the lower portion 11 of the hearth assembly. Because of a block (not shown) in the channel 17 near the entrance opening 27, the fluid makes one nearly complete circumference of the hearth to an exit opening 27' and flows from the channel 17 into a second internal passageway 26' (shown in FIG. 4) in the lower portion of the rotatable assembly. This second internal passageway leads downward to a circumferential exit channel 28 which is similar in construction to the entrance channel 24. From the exit channel 28, a second vertical passageway 33' leads down inside the base and out through a fluid outlet 32'. A fluid seal between the rotatable hearth assembly and the base is provided by two O-rings 29 and 29' which are, respectively, above and below the pair of channels 24 and 28.

The electron-beam source 50 fits inside a cavity 40 which is surrounded by the rotatable hearth assembly 10. The beam source includes an electron gun, shown generally by 60, and magnetic means 70 for deflecting the beam through a large angle onto the hearth. Magnetic means 80 for sweeping the beam may also be included.

The beam source 50 is covered by a convex circular plate 51. The diameter of the cover plate is such that there is only a narrow gap between the edge 54 of the cover plate and the inner perimeter 14 of the hearth. The narrowness of this gap, as well as the rim 15 of the hearth, help prevent material placed on the hearth or other debris from falling down inside the gap. The cover plate has an opening 52 through which the electron beam passes. However, the electron gun itself is protected by a segment 53 of the cover plate which is directly above the gun.

Figure 2:
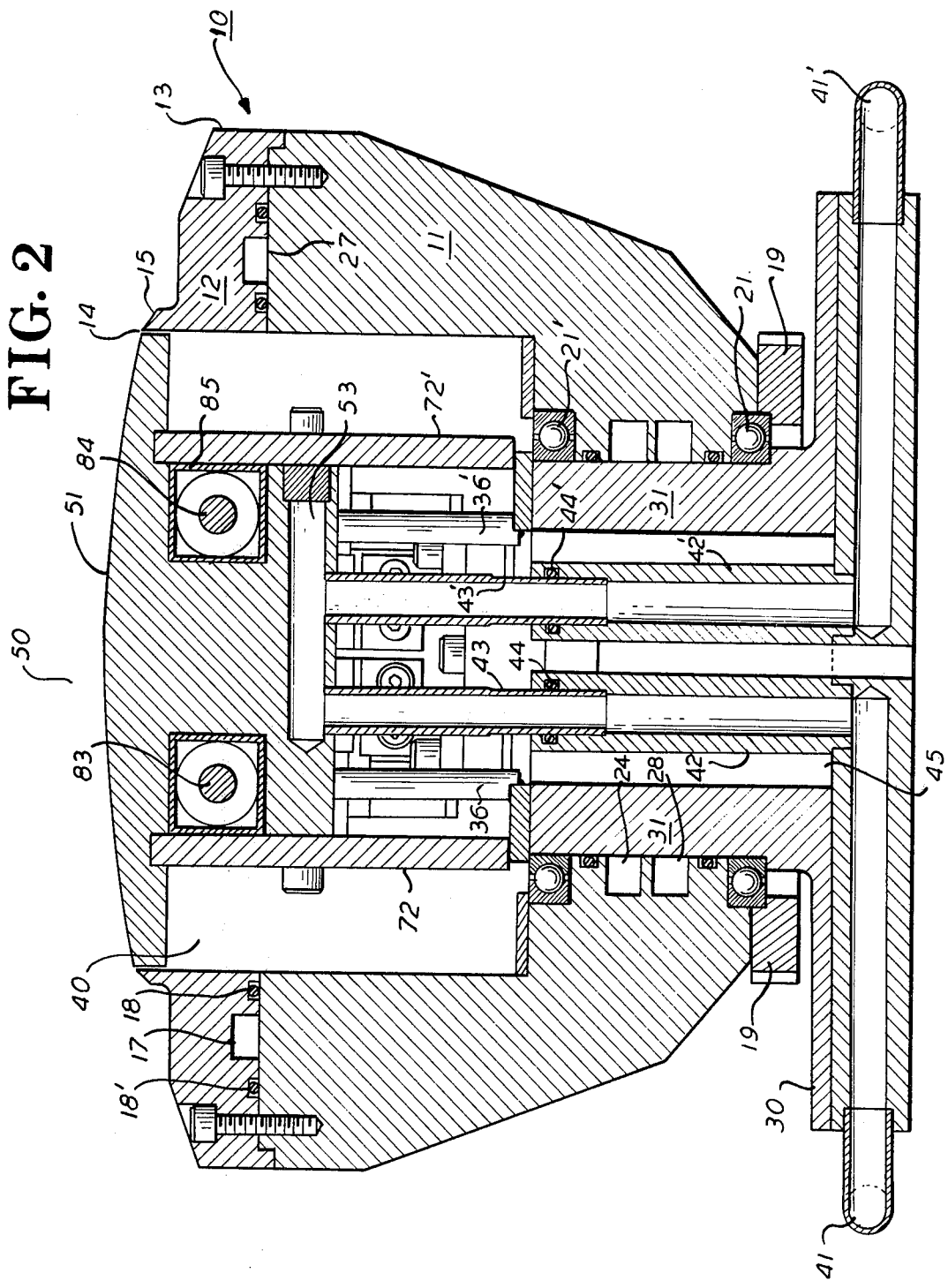
FIG. 2 is a cross-sectional elevational view of the vapor source as it appears when cut along the line 2—2 in FIG. 1.

The details of the construction of the electron beam source can be more fully appreciated by reference to FIG. 2. The beam source is supported by two vertical rods 36 and 36', the lower ends of which are fixed to the upward extension of the base 31. The cover plate 51 of the electron beam source is demountably secured to the base by two screws (not shown) which extend downward through clearance holes in the cover plate and engage the support rods.

A second fluid conduit is provided as a means for controlling the temperature of the cover plate 51. The base 30 has a fluid inlet 41 which leads to a vertical pipe 42. The lower end of pipe 42 is fixed to the base. The pipe 42 extends upward in a central cavity 45 which is surrounded by the upward extension 31 of the base. The upper end of a second pipe 43 is fixed to the cover plate 51 at one end of an internal channel 53. The pipe 43 extends downward and slidably engages the interior of the pipe 42. An O-ring 44 provides a fluid seal of the slip joint formed by the engaged pipes. Fluid exits from the other end of channel 53 by flowing downward through the pipe 43' which slips inside pipe 42' which is attached to the base and leads to the fluid exit 41'.

The construction and operation of an electron gun, such as 60, and beam deflection and sweeping means, such as 70 and 80, are known in the art. The construction of these features will be described only briefly. A more complete description is contained in U.S. Pat. No. 3,710,072 for a "Vapor Source Assembly" which issued Jan. 6, 1973 to Robert L. Shrader and Kazumi N. Tsujimoto.

Figure 3:
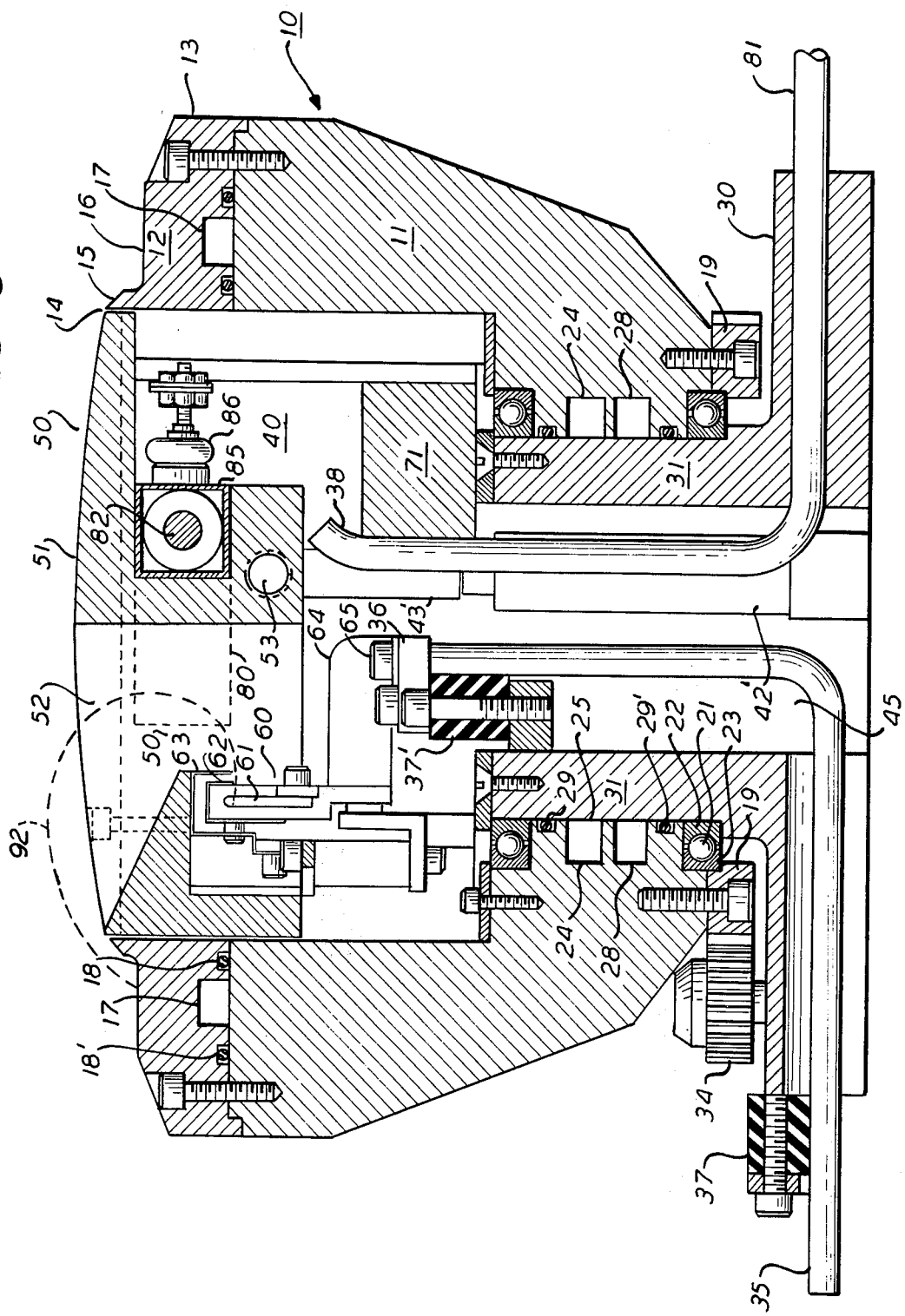
FIG. 3 is a cross-sectional elevational view of the vapor source as it appears when cut along the line 3—3 in FIG. 1.

Referring now to FIG. 3, the electron gun 60 has an inverted U-shaped filament 61, a beam forming plate 62 and an anode plate 63. In operation, the anode plate is maintained at ground potential; the beam forming plate and the filament are maintained at a high negative potential. Filament current is provided by a power supply (not shown) an end of which is connected to the conductor 35 which is insulated from the base 30 by the support 37. The conductor 35 runs through a horizontal passage which leads to the central cavity 45 in the base 30. The conductor 35 runs upward through the cavity 45 and terminates on a bar 36. The conducting bar 36 is supported by an insulating block 37' which is fixed to the wall of the central cavity 45 of the base. A terminal 64 connected to one side of the filament 61 can be detachably connected to the conducting bar 36 by means of a screw 65. In a similar manner, the power supply is connected to the other side of the filament 61 by means of an insulated conductor 35', conductor bar 36' and screw 65', as shown in FIG. 1.

The beam deflection means 70 provides a magnetic field which is generally perpendicular to the plane of the view shown in FIG. 3. The magnetic field is produced by a permanent magnet 71 which is attached to two pole pieces 72 and 72' (shown in FIGS. 1 and 2). The pole pieces are both attached to the cover plate 51. The poles of permanent magnet 71 are oriented so that the magnetic field in the region of the electron gun 60 is directed out of the plane of FIG. 3. The electron beam moving horizontally away from the gun is deflected upward so that it passes through the opening 52 and is incident on the impact area 91 (shown in FIG. 1). The electron beam is deflected about 270° from its initial to its final direction. The electron beam moves along a curved path as shown by the dashed center-line 92. During the final portion of the path from filament 61 to impact area 91, the beam is directed generally away from the rotational axis 20.

A beam sweeping means 80 may be provided to vary the location of the impact area. The beam sweeping means may include three electromagnets, 82 (shown in FIG. 3), 83 and 84 (shown in FIG. 2). The electromagnets are contained in a housing 85 which is attached to the cover plate 51 and which supports four electrical terminals, similar to the terminal 86, which make appropriate contact with the electromagnets. Four connecting wires (shown in FIG. 1) lead from the four terminals through a wire tube 38 which leads down inside the central cavity 45 and out through another horizontal passageway in the base 30. The wires emerging from the tube can be connected to a suitable power supply which can be controlled as desired.

The beam source assembly 50 can be easily and quickly removed by disengaging the two screws which extend through the cover plate 51 into the support rods 36 and 36', and the screws 65 and 65' which complete the electrical connections to the filament. Convenient access for removing screws 65 and 65' is available through the cover plate opening 52. On removal, the pipes, 43 and 43', attached to the electron beam source, slide outward and disengage from the pipes 44 and 44', attached to the base. The four wires leading from the terminals of the sweeping means slide easily through the wire tube 38. Installation of the assembly is easily accomplished by reversing the procedure.

It can now be appreciated that the electron-beam evaporation apparatus which has been described has a number of features which make it useful as a vapor source for coating a substrate by vacuum vapor deposition.

One important feature is the compactness which is gained by fitting the electron beam source, including magnetic deflection means, inside both the outer and inner perimeters of the annular hearth. The electron gun is well protected from both the vapor cloud and falling debris by virtue of its location under a cover plate below the plane of the annular area on the hearth where the evaporant material is placed. Two conduits for circulating fluids are provided to independently control the temperature of the hearth and cover plate. Thus, virtually all of the upper surface of the apparatus, with the exception of the electron-beam impact area, can be maintained at a given temperature.

In a substrate coating operation, the vapor source and substrate are installed in a chamber which can be evacuated to about $10^{-4}$ torr or less. Generally, the substrate is supported above the hearth where it intercepts the vapor streaming upward from the hearth. Evaporant material is placed in the hearth, either manually or by a mechanical feeder. The electron beam source is energized by supplying power to the electron gun and, if desired, the beam sweeping means. As the hearth rotates, the material placed in the hearth is carried into the path of the electron beam in the impact area and is evaporated.

The electron-beam evaporation apparatus which has been described has been used to deposit coatings on substrates by vaporizing a variety of materials. Three examples will be discussed to illustrate the operation of the apparatus. In each case a desired quantity of the material to be evaporated was placed on the hearth and rotated under the geam. The quantity of material placed on the hearth, the rotational rate, and the beam power were adjusted so that all of the material was evaporated as it passed through the beam impact area. The actual values of these parameters can easily be determined in any particular coating situation with a minimum of experimentation. The coating was formed on a substrate which was placed above the hearth.

A fused silica coating was deposited on a substrate by evaporating granular silica placed on the hearth. The electron accelerating potential was 8 kV and the electron-beam power was 2 kW. In a second example, a boron oxide and fused quartz in granular form were mixed in a ratio of 1 to 3 and placed on the hearth. A substrate coating was formed with an electron-beam power of 1.8 kW. In a third example, a tungsten-aluminum alloy was formed on a substrate by evaporating short lengths of aluminum and tungsten wire which were placed side by side on the hearth. An electron-beam power of 3 kW was sufficient to evaporate both wires.

What is claimed is:

1. An electron-beam apparatus for evaporating material placed on a hearth, comprising:
   a hearth mounted for rotation about a generally vertical axis, the hearth having a point which is furthest from the axis and an annular area for receiving material to be evaporated, the annular area lying generally in a horizontal plane perpendicular to the rotational axis;
   an electron-beam gun which can be energized to form an electron beam for evaporating material located within an impact area in the annular area on the hearth, all of which electron-beam gun is located closer to the rotational axis than the point of the hearth which is furthest from the axis; and
   magnetic means for deflecting the beam from the electron gun to the impact area along a curved path the final portion of which path is directed generally away from the axis of rotation.

2. The electron-beam apparatus as recited in claim 1 wherein the beam deflecting means is located closer to the rotational axis than the point of the hearth which is furthest from the axis; and
   wherein the electron-beam gun is located below the horizontal plane of the annular area of the hearth.

3. The electron-beam apparatus as recited in claim 2 wherein:
   the hearth is annular, having an inner perimeter which is substantially equidistant from the axis of rotation, and
   all of the electron-beam gun and the beam deflecting means are located closer to the rotational axis than the inner perimeter.

4. The electron-beam apparatus as recited in claim 3 further comprising:
   means for controlling the temperature of the hearth.

5. The electron-beam apparatus as recited in claim 4 further comprising:
   a cover plate for generally covering the area inside the inner perimeter of the hearth, the cover plate having an opening through which the electron beam passes from below to above the cover plate; and
   means for controlling the temperature of the cover plate.

6. The electron-beam apparatus as recited in claim 5 wherein the cover plate has a segment which lies directly above the electron-beam gun, the initial direction of the electron beam is generally horizontal and toward the axis of rotation, and the beam deflection means deflects the electron beam through an angle greater than 230°.

7. The electron-beam apparatus as recited in claim 6 wherein:
   the electron-beam source is removably mounted for convenient servicing.

8. The electron-beam apparatus as recited in claim 7 wherein:
   the beam deflection means comprises a permanent magnet, and
   the electron-beam source further comprises an electromagnetic means for varying the location of the impact area on the hearth.

9. An evaporation source for electron-beam evaporation in a vacuum comprising:
   an annular hearth having an inner perimeter and a substantially horizontal surface from which material is evaporated;
   means for rotating said hearth about a generally vertical central axis;
   means located wholly within the inner perimeter of said hearth and below the surface thereof for forming an electron beam; and
   means for deflecting said electron beam upward from said beam forming means, across the inner perimeter, above said surface and onto a localized area of said surface outside the inner perimeter of said annular hearth.

10. The apparatus according to claim 9 further comprising:
    an enclosure for isolating said electron beam forming means from evaporated material and falling debris, said enclosure having an opening through which the beam is deflected from inside to outside of the enclosure.

11. The apparatus according to claim 10 wherein the electron beam is deflected upward from an initial direction which is generally horizontal and toward the central axis.

* * * * *